455-296 SR
FIP8106 OR 2,730,615
SEARCH ROOM

Jan. 10, 1956 M. R. MANTZ 2,730,615

CIRCUIT-ARRANGEMENT FOR REDUCING PULSE INTERFERENCE IN RADIO RECEIVERS

Filed Feb. 21, 1951

INVENTOR
MARIUS ROBERT MANTZ
BY
AGENT

United States Patent Office 2,730,615

Patented Jan. 10, 1956

2,730,615

CIRCUIT-ARRANGEMENT FOR REDUCING PULSE INTERFERENCE IN RADIO RECEIVERS

Marius Robert Mantz, Hilversum, Netherlands, assignor to Hartford National Bank and Trust Company, Hartford, Conn., as trustee Application February 21, 1951, Serial No. 212,092

Claims priority, application Netherlands March 1, 1950

2 Claims. (Cl. 250—20)

This invention relates to a circuit arrangement for reducing pulse interference in radio receivers by utilizing the clipping action of a diode or similar unidirectional device.

Circuit arrangements of this kind, which limit positive and or negative pulses to a predetermined value, are well known in the art. In such circuits, the signal source is generally the receiver detector, which is connected in series through a high resistance to the limiter circuit. In addition the output energy from this circuit is supplied through a series combination of a resistor and capacitor, so that limiting signal current passed through the limiter circuit increases with increasing signal frequency.

The object of this invention is to improve the above type of circuit so that pulses occurring in the signal voltage are not only limited, but are also almost completely suppressed. Since the time rate of change of pulse voltage is generally much greater than the time rate of change of signal voltage, it is possible to distinguish between these two types of voltage.

According to the invention, the pulse voltage is caused to develop a component of current which is substantially proportional to the time rate of change of pulse voltage. This current component can only be produced if the series resistance connecting the signal source with the limiter circuit is reduced to a minimum, and if the output impedance of this circuit is made primarily capacitive for signal frequencies. More specifically, the total series resistance of the signal source and the limiting circuit should not exceed 5000 ohms, a preferable value being 1000 ohms. In any event, the total resistance must be small when compared with the capacitive output impedance whose value is measured at the highest signal frequency. This capacitive output impedance must be small when compared with a resistance connected in parallel with it. The value of this impedance should not be less than 500 micromicrofarads, a preferable value being 1000 micromicrofarads.

The capacitive output impedance will introduce some linear distortion of the signal voltage, but maintaining the total series resistance to values discussed above will reduce this distortion to an inappreciable amount.

As a result of the above circuit improvements, application of a pulse voltage will interrupt the current flow through the unidirectional device almost instantly, thus effectively disconnecting the signal source from the limiter circuit. Removal of the pulse voltage will allow the circuit to operate normally.

The capacitive output impedance may charge or discharge during the time the pulse voltage is supplied to the limiter circuit. This charging or discharging may introduce a spurious signal which acts as an interference. As a further feature of the invention, a means is provided for maintaining a fixed voltage across this output impedance while the current flow across the unidirectional device is interrupted.

Since the signal source usually has too large an internal resistance for the purposes of this invention, a negative feedback amplifier or cathode follower is generally interposed between the signal source and the limiter circuit in order to reduce the limiter input resistance to the desired value.

The polarity of the pulse voltage determines the sense of the unidirectional device. In case of a fixed polarity pulse, one such device is used. When the pulse polarity varies, two such devices are connected in opposite senses.

As previously stated, the time rate of change of pulse voltage must exceed the time rate of change of signal voltage. Thus, the bandwidth of the signal supplied to the receiver detector must be wider than is necessary for passage of the signal, preferably a frequency band of at least 20 kilocycles. In addition, the time constant of the receiver detector must be small enough to avoid excessive increase in pulse voltage duration.

In order that the invention may be more clearly understood and readily carried into effect, it will now be described in detail with reference to the accompanying drawings wherein like numerals are used in the figures when referring to corresponding components.

Figures 1, 2, 3, 4, 5, 6:
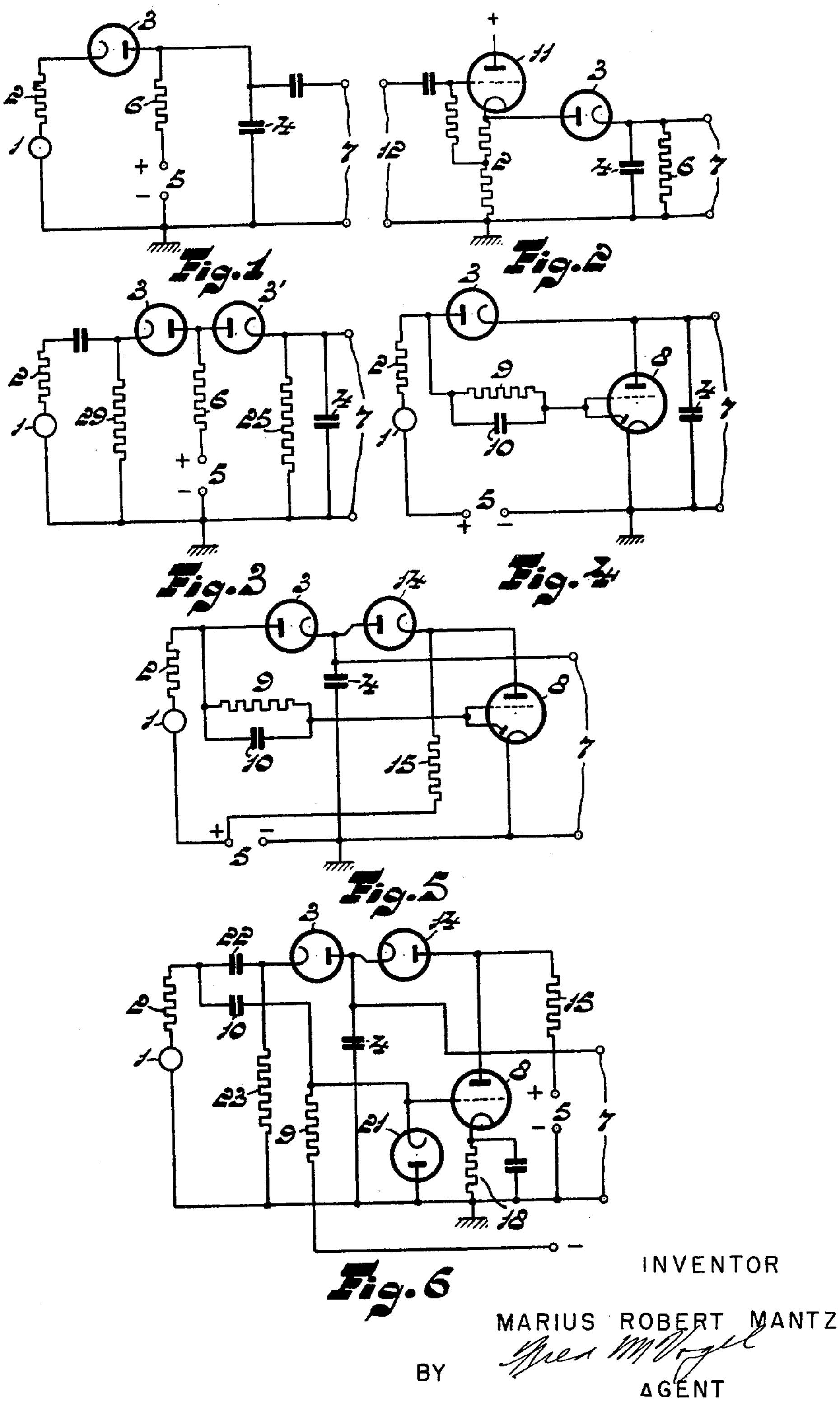
Figure 1 illustrates the principle of the invention.
Figure 2 shows a circuit arrangement for eliminating negative pulse voltages.
Figure 3 shows a circuit arrangement for eliminating both positive and negative pulse voltages.
Figure 4 shows a circuit arrangement which eliminates negative pulse voltages and also maintains a fixed voltage across the capacitive output impedance while a pulse voltage is being applied.
Figure 5 shows a circuit arrangement similar to, but possessing greater sensitivity than that shown in Figure 4.
Figure 6 shows a circuit arrangement which eliminates positive pulse voltages and also maintains a fixed voltage across the capacitive output impedance while a pulse voltage is being applied.

The principle of the invention is evident from the circuit-arrangement shown in Figure 1, it being assumed that the signal source pulses which are to be suppressed possess positive polarity. Referring to Figure 1, the numeral 1 designates the low frequency signal source, and 2 designates the internal impedance of the source. A diode 3 is connected in series therewith. The output voltage is taken from terminals 7. Because of the direct voltage source connected across terminals 5, the diode 3 normally passes such a direct current that it is capable of also permitting complete passage of the signal currents. A high resistance 6 interposed between the terminals 5 and diode 3 ensures that the said direct voltage source does not constitute a short-circuit for the output oscillations.

A capacitor 4 is connected in parallel with the output terminals 7. When a positive pulse with steep leading and trailing edges is supplied from the signal source where the resistance of the circuit formed by the elements 1, 2, 3 and 4 is sufficiently low, the capacitor 4 will tend to absorb a current directly proportional to the steepness of the edges. This current is limited, since it cannot exceed the value of the direct current which passes through the diode 3 in opposite sense.

Figure 2 shows a circuit-arrangement according to the invention, in which negative pulses can be eliminated. The signal source is constituted by the resistance 2, which is included in the cathode lead of a preceding low-frequency amplifying tube 11. The terminals 12 can be connected to the normal detector resistance of the receiver. The resistance 2 can be looked upon as a signal source of very low impedance. In this circuit-arrangement the supply voltage source for the anode of the tube 11 also serves as a source supplying the low steady current for the diode 3.

A circuit-arrangement suitable for eliminating both positive and negative pulses is shown in Figure 3. The circuit-arrangement comprises two diodes 3 and 3' oppositely connected in series, the low steady currents of which can be adjusted to the values desired with the use of resistances 29 and 25. The operation of the circuit-arrangement is otherwise entirely similar to that of the arrangements shown in Figs. 1 and 2.

Although in the circuit-arrangements described highly satisfactory pulse suppression is obtainable, spurious signals may still be generated. For example, in the circuit-arrangement shown in Figure 1, when a pulse is supplied, the capacitor 4 is charged across the resistance 6. The resistance 6 has a very high value compared with the impedance 2 of the voltage source 1 and the impedance of the diode 3, so that under normal conditions only a comparatively low voltage exists across the terminals of the capacitor 4. For example if the voltage of the source 5 is 250 volts and the value of the resistance is 20 times that of the other resistances, this voltage will be approximately 12 volts. However, when the current flow across the diode 3 is interrupted by application of a pulse, the voltage across the capacitor 4 will tend to increase to a value of 250 volts. In general, the duration of the pulse is very short, so that the increase in voltage will be comparatively insignificant. Under certain conditions it may however, be so great that, after the suppression of the pulse and after the diode 3 again conducts current, a comparatively marked difference occurs between the value of the signal voltage at the instant of the suppression of the pulse and the value of the instantaneous voltage across the terminals 7 so that distortions may occur which are in themselves pulsatory. A similar phenomenon may occur in the circuit-arrangement shown in Figure 2. Here, over the duration of the pulse, the capacitor 4 will be discharged across the resistance 6. According to the invention, this phenomenon may be eliminated by maintaining a fixed charge on the capacitor 4 during the period of pulse application. Figure 4 shows a circuit-arrangement which will maintain the fixed charge without impairing the pulse suppression characteristics of the circuits previously discussed.

Referring to Figure 4, similar component members are designated by like reference numerals as in Figure 1. This circuit-arrangement comprises an additional element, a discharge tube 8 shown as a diode-triode, the triode part of which has the same function as the resistance 6 of Figure 2. Under normal conditions the diode 3 will conduct current, the magnitude of which is primarily determined by the impedance of the triode portion of the tube 8, which will be chosen to be comparatively high. Across the resistance 9 a positive bias voltage is applied to the diode of the tube 8 so that this diode practically constitutes a short-circuit for all the signal voltages. The low steady current of this diode must be adjusted so that it will slightly exceed the largest signal current that will be developed. Since the value of the resistance 9 considerably exceeds the impedance of the capacitor 10 connected in parallel therewith, and since this auxiliary circuit passes a capacitive current, the current flowing in the auxiliary circuit will be substantially proportional to the variation of the input voltage with time. Consequently current components due to an interfering pulse will be great enough for the diode to become non-conducting so that substantially the entire negative pulse voltage will be developed at the control-grid of tube 8 connected to the anode of the diode, with the result that this tube becomes non-conducting. Thus during the occurrence of the pulse the capacitor 4 is effectively isolated and is not capable of varying its voltage.

In the circuit-arrangement shown in Figure 4 substantially no interfering phenomena can occur, since it is assumed that the capacitor 4 cannot be discharged across the load impedance connected to the terminals 7. If necessary a capacitor of fixed value may be connected in series therewith. A further circuit-arrangement, in which the same result is obtained upon the occurrence of negative pulses, is shown in Figure 5.

Apart from the elements shown in Figure 4, this circuit-arrangement comprises a second diode 14, which is connected in series with the tubes and the anode of which is connected to the cathode of the diode 3. A resistance 15 is inserted between the positive terminal of the supply source and the anode of tube 8. The various circuit elements are so proportioned that the direct current required to allow undistorted passage of the desired signal, passes through the diode 3 and also through the diode 14. The circuit-arrangement otherwise operates in substantially the same manner as that shown in Figure 4, except that it is no longer necessary to render the tube 8 completely non-conducting for the purpose of isolating capacitor 4. It is only necessary to reduce the current flow through tube 8 to such a value that the diode 14 becomes non-conducting. Thus a circuit-arrangement is obtained which is more sensitive than the arrangement shown in Figure 4, since now the tube 8 can also be adjusted to operate at that part of its characteristic curve in which the mutual conductance is great.

The tube 8 shown in Figures 4 and 5 is not necessarily a diode-triode; the diode function may be performed by the control-grid, and the tube may comprise further grids. An electron beam tube may also be used as a slight variation of the voltage across the control-electrode and can result in an abrupt interruption of the current.

Figure 6 shows a circuit-arrangement permitting positive pulses to be suppressed. In this case it is necessary to add some more elements. Thus, for example, the auxiliary diode 21, by which the control-grid of the tube 8 is connected to ground, is to be supplied through a resistance 9 from a negative voltage source. In order to avoid grid current, which might produce undue charging voltages across the capacitor 10, the cathode lead of the tube 8 must be provided with a resistance 18 and a parallel-connected capacitor. In order to avoid short-circuiting the direct anode voltage of the tube 8 by the signal source, a blocking capacitor 22 is included in the circuit and the direct current path is completed by a resistance 23. So that charging voltages of the capacitor 22 may not prove troublesome, the time constant of the assembly of the capacitor 22 and the resistance 23 is such that the input signal is set up substantially undistorted across the resistance 23.

In this circuit-arrangement all the diodes conduct current under normal conditions. However, as soon as a positive pulse occurs, the diode 3 and also the diode 21 will suppress the current. Then the positive pulse will become operative across the control-grid of the tube 8 connected to the cathode of the diode 21, so that the tube 8 becomes highly conducting, and the anode voltage of this tube abruptly drops to such an extent that the diode 14 becomes non-conducting. The output capacitor 4 is then again insulated from the other parts of the arrangement and retains its charge while the pulse is applied. After the disappearance of the pulse all the diodes again become conducting and the output voltage will again be able to follow the input voltage.

What I claim is:

1. In a radio receiver including a detector for producing a desired signal subject to having interference pulses, which has a faster time rate of change than that of said desired signal, a circuit for reducing said interference pulses, comprising a cathode follower including an electron discharge tube having a grid connected to receive said signal and having a cathode output electrode, a load resistor connected at an end thereof to said cathode, a two-terminal unidirectionally-conductive element biased to be normally conductive for said signal and having one terminal thereof connected to said cathode, and a capacitor and an output resistor connected in parallel directly between the remaining terminal of said unidirectionally-conductive element and the remaining end of said load resistor, the sum of the effective value of said load resistor and the internal resistance of said unidirectionally-conductive element being low compared with the impedance of said capacitor for the highest desired frequency of said desired signal, whereby upon the occurrence of said interference pulses the current passing through said unidirectionally-conductive element becomes interrupted substantially immediately.

2. In a radio receiver including a detector for producing a desired signal subject to having interference pulses which have a faster time rate of change than that of said signal, a circuit for reducing said interference pulses, comprising a cathode follower stage including an electron discharge tube having a cathode, a grid and an anode, means connected to apply said signal to said grid, means connected to apply to said anode a positive-polarity potential with respect to electrical ground, a load resistor connected between said cathode and electrical ground, a diode having a plate connected directly to said cathode and having a cathode, and a capacitor and an output resistor connected in parallel directly between said last-named cathode and electrical ground, thereby biasing said diode to be normally conductive for said signal, the sum of the effective value of said load resistor and the internal impedance of said diode being low compared with the impedance of said capacitor for the highest desired frequency of said desired signal, whereby upon the occurrence of said interference pulses the current passing through said diode becomes interrupted substantially immediately.

References Cited in the file of this patent

UNITED STATES PATENTS

| | | |
|---|---|---|
| 2,087,288 | Landon | July 20, 1937 |
| 2,281,395 | Travis | Apr. 28, 1942 |
| 2,304,713 | Smith | Dec. 8, 1942 |
| 2,383,420 | Scoles | Aug. 21, 1945 |
| 2,418,389 | Andressen | Apr. 1, 1947 |
| 2,525,298 | Hughes | Oct. 10, 1950 |
| 2,611,821 | Denton | Sept. 23, 1952 |

FOREIGN PATENTS

| | | |
|---|---|---|
| 605,206 | Great Britain | July 19, 1948 |

OTHER REFERENCES

"Ignition Interference Suppression on the Televisor," Electronic Engineering, vol. 20, No. 246, August 1948, page 243.